(12) United States Patent
Coudrain et al.

(10) Patent No.: US 7,902,621 B2
(45) Date of Patent: Mar. 8, 2011

(54) INTEGRATED CIRCUIT COMPRISING MIRRORS BURIED AT DIFFERENT DEPTHS

(75) Inventors: Perceval Coudrain, Grenoble (FR);
Philippe Coronel, Barraux (FR); Michel Marty, Saint Paul de Varces (FR);
Matthieu Bopp, Fortschwihr (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 12/398,872

(22) Filed: Mar. 5, 2009

(65) Prior Publication Data

US 2009/0256224 A1 Oct. 15, 2009

(30) Foreign Application Priority Data

Mar. 7, 2008 (FR) .................................... 08 51494

(51) Int. Cl.
*H01L 31/0232* (2006.01)
*H01L 27/14* (2006.01)
*H01L 31/00* (2006.01)
*H01L 31/06* (2006.01)
*H01L 27/15* (2006.01)

(52) U.S. Cl. ......... 257/432; 257/431; 257/444; 257/463; 257/79

(58) Field of Classification Search .................. 257/432, 257/431, 444, 462, 463, 79, 80
See application file for complete search history.

(56) References Cited

U.S. PATENT DOCUMENTS

| 6,333,545 | B1 | 12/2001 | Ema |
| 6,750,541 | B2 | 6/2004 | Ohtsuka et al. |
| 7,615,399 | B2 * | 11/2009 | Lee ................................. 438/70 |
| 7,638,852 | B2 * | 12/2009 | Hsu et al. ...................... 257/432 |
| 2005/0035381 | A1 | 2/2005 | Holm et al. |
| 2005/0233493 | A1 | 10/2005 | Augusto |
| 2007/0063299 | A1 | 3/2007 | Hwang |
| 2007/0114627 | A1 | 5/2007 | Roy et al. |
| 2007/0152250 | A1 | 7/2007 | Kim |
| 2008/0036022 | A1 | 2/2008 | Hwang et al. |

FOREIGN PATENT DOCUMENTS

WO  WO 2008017490 A2  2/2008

OTHER PUBLICATIONS

French Search Report dated Oct. 2, 2008 from French Patent Application No. 08/51494.

* cited by examiner

*Primary Examiner* — Chuong A. Luu
(74) *Attorney, Agent, or Firm* — Lisa K. Jorgenson; James H. Morris; Wolf, Greenfield & Sacks, P.C.

(57) ABSTRACT

A semiconductor structure including a first active area under which is buried a first reflective layer and a least one second active area under which is buried a second reflective layer, wherein the upper surface of the second reflective layer is closer to the upper surface of the structure than the upper surface of the first reflective layer.

13 Claims, 4 Drawing Sheets

US 7,902,621 B2

INTEGRATED CIRCUIT COMPRISING MIRRORS BURIED AT DIFFERENT DEPTHS

CROSS REFERENCE TO RELATED APPLICATIONS

This application claims the priority benefit of French patent application number 08/51494, filed on Mar. 7, 2008, entitled "INTEGRATED CIRCUIT COMPRISING MIRRORS BURIED AT DIFFERENT DEPTHS," which is hereby incorporated by reference to the maximum extent allowable by law.

BACKGROUND OF THE INVENTION

1. Field of the Invention

The present invention relates to integrated circuits comprising components formed in active semiconductor areas and, more specifically, is integrated circuits in which reflective layers are placed under the active semiconductor areas.

2. Discussion of the Related Art

Conventionally, integrated circuits are divided into several active areas formed in a semiconductor substrate. In the case of integrated circuits intended to detect images, each active area or pixel comprises at least one photon-capture layer, typically a lightly-doped photodiode layer, and an associated transfer transistor. When the circuit is illuminated, the photons of the incident light beam penetrate into the capture layer and create electron/hole pairs therein. The electrons are transferred to an electronic circuit by the associated transfer transistor.

The depth of the capture layer at which most of the electron/hole pairs are formed depends on the wavelength of the incident light beams. For example, if the circuit is illuminated by a blue light beam (short wavelength), most of the electron/hole pairs form in the first micrometer of the capture layer. Conversely, in the case of a red light beam, most of the electron/hole pairs form in the first three or four micrometers of the capture layer.

To improve the image detection, it has been provided to place a reflective layer under the different active areas. When a photon originating from a light ray of large wavelength penetrates deeply into the capture layer, it is sent back to the surface by the reflective layer. The associated electron/hole pair is then formed as the photon returns up to the photodiode. This enables increasing the probability for the electron to be captured by the photodiode.

U.S. Pat. No. 2006/0118897 A1 describes a method for forming a structure comprising a photodiode under which is placed a mirror. In this method, it is started from a structure of silicon-on-insulator type (SOI). Walls for separating and insulating the different active areas are formed in the silicon layer and in the insulating layer. The insulating material is then etched, via openings formed in the silicon, and a reflective material is deposited in the etched space. The different elements of the active areas (photodiodes and transistors) are then formed in and on the silicon layer located above the reflective material.

The above-described method has the disadvantage of requiring an SOI-type structure. Further, this method does not allow the forming of reflective layers under different silicon thicknesses.

SUMMARY OF THE INVENTION

An object of the present invention is a semiconductor structure comprising several active areas under which reflective layers are formed at different depths.

Another object of the present invention is a method for forming such a structure on solid silicon.

To achieve all or part of these objects as well as others, at least one embodiment of the present invention provides a semiconductor structure comprising a first active area under which is buried a first reflective layer and a least one second active area under which is buried a second reflective layer, wherein the upper surface of the second reflective layer is closer to the upper surface of the structure than the upper surface of the first reflective layer.

According to an embodiment, the first and second reflective layers are made of tungsten.

According to an embodiment, the structure further comprises a third active area under which is buried a third reflective layer, the upper surface of the third reflective layer being closer to the upper surface of the structure than the upper surface of the second reflective layer.

According to an embodiment, at least one embodiment of the present invention provides a method for forming at least two mirrors buried at different depths in silicon, comprising the steps of: forming a first regular array of openings and a second regular array of openings, respectively in a first and in a second region of the silicon, the ratio between the cross-section of the openings and the pitch of the openings being smaller than that of the second array of openings; annealing the structure, whereby a first cavity and a second cavity having their upper surfaces at different levels form in the silicon; forming a thin insulating layer on each of the walls of the first and second cavities; and forming a reflective layer against the thin insulating layer in the first and second cavities.

According to an embodiment, the structure is annealed with hydrogen and at a temperature greater than 1100° C.

According to an embodiment, a first trench is formed next to the first array and a second trench is formed next to the second array, at the same time as the first and second arrays of openings.

According to an embodiment, the reflective layer is formed by an atomic layer deposition method.

According to an embodiment, the method further comprises a step of epitaxial deposition of a silicon layer.

According to an embodiment, the first and second arrays of openings, as well as the first and second trenches, have equal depths and are formed by plasma etching.

According to an embodiment, the reflective layer is made of tungsten.

The foregoing objects, features, and advantages of the present invention will be discussed in detail in the following non-limiting description of specific embodiments in connection with the accompanying drawings.

DETAILED DESCRIPTION

As usual in the representation of semiconductor structures, the various drawings are not to scale. Further, only those elements and steps which are useful to the understanding of various embodiments of the present invention have been shown and will be described.

Figure 1:
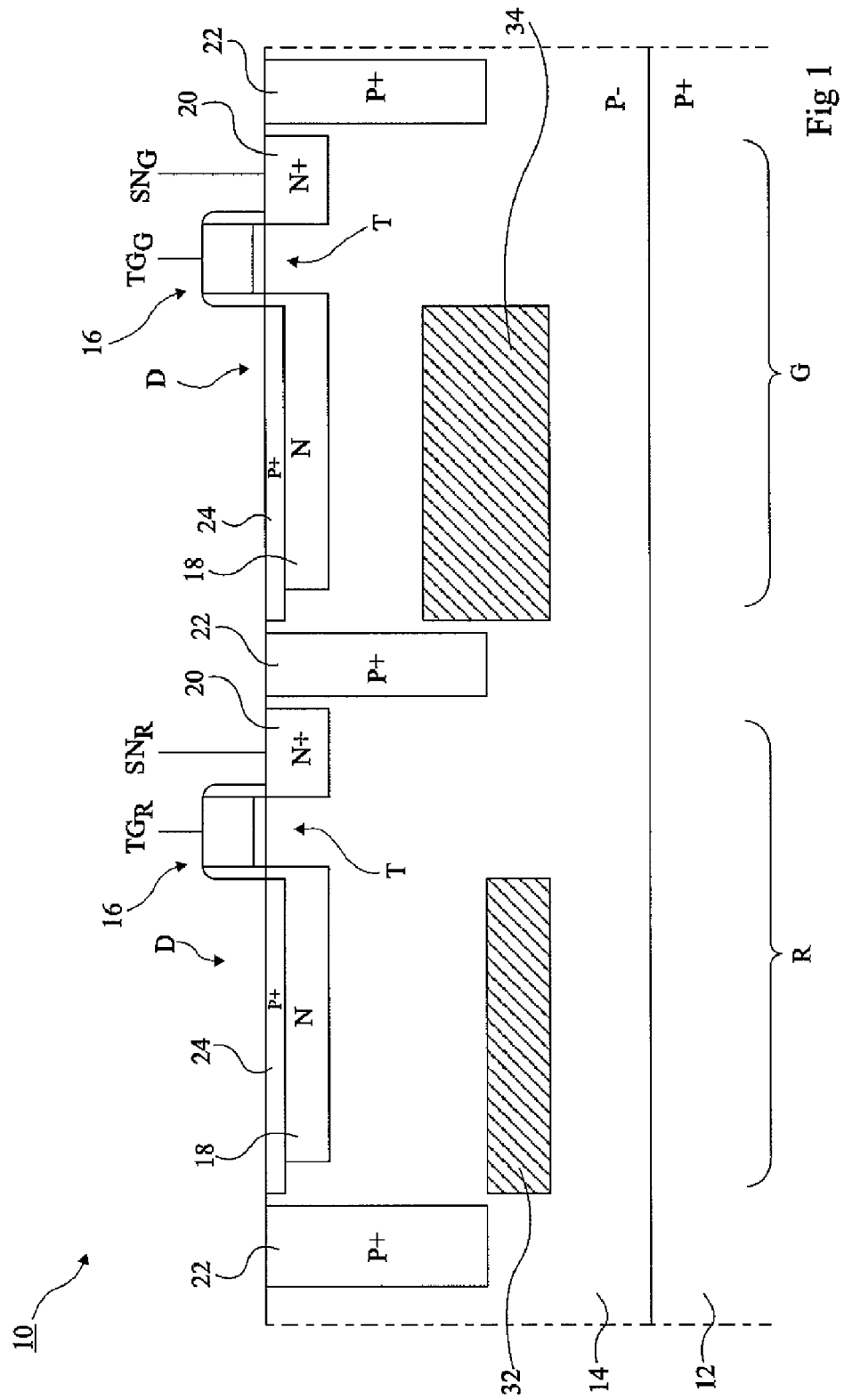
FIG. 1 is a simplified cross-section view of an image sensor comprising two active areas.

FIG. 1 illustrates a portion of an embodiment of an image sensor 10. Two active areas R and G are shown, each active area comprising a photodiode D and a transfer transistor T. In the present description, the elements common to the two active areas will be designated with the same reference numerals. Further, it will be considered that active area R is associated with red light rays and that active area G is associated with green light rays. Adapted color filters (not shown) are formed, preferably, above each active area.

A lightly-doped P-type silicon layer 14 extends on a heavily-doped P-type silicon substrate 12. Silicon layer 14 is, for example, an epitaxial layer on silicon substrate 12, substrate 12 being connected to a reference voltage. Above each active area is formed an insulated gate structure 16, possibly provided with lateral spacers. On either side of gates 16, at the surface of layer 14, are N-type source and drain regions 18 and 20. Drain regions 20, to the right of gates 16, are heavily N-type doped (N$^+$). Source regions 18 are formed on a larger surface area than drain regions 20. Regions 18 form, with layer 14, the junctions of photodiodes D. Gates 16 and drains 20 are solid with metallizations (not shown) which enable putting in contact these regions respectively with a transfer control signal (contacts $TG_R$ and $TG_G$, respectively for active areas R and G) and with an electronic circuit, not shown (contacts $SN_R$ and $SN_G$, respectively for active areas R and G).

The structure is completed by heavily-doped P-type regions 22 (P$^+$) located on either side of active areas R and G and extending deeply into epitaxial layer 14. Regions 22 are connected to the reference voltage via layer 14 and substrate 12. Regions 22 enable insulating the active areas and also enable avoiding that electrons intended for a photodiode are captured by a neighboring photodiode (crosstalk phenomenon).

In the shown example, photodiodes D comprise, at the surface of regions 18, shallow P-type regions 24, more heavily doped (P$^+$) than layer 14. Photodiodes D are then called depleted or pinned photodiodes since the voltages of regions 18 of the photodiodes are, in the absence of lighting, only set by the dopant concentrations of regions 14, 18, and 24.

In the foregoing, a specific type of photodiode known per se has been described and schematically shown. The mirrors which will be described hereafter may be used with any other type of photodiode.

A layer 32 of a material having its interface with the silicon exhibiting a high reflective power is formed under the photodiode associated with active area R. Similarly, a layer 34 of a material of same type as that of layer 32 is formed under the photodiode associated with active area G. The upper surface of layer 34 (active area G) is closer to the upper surface of silicon 14 than the upper surface of layer 32 (active area R).

When the circuit is illuminated, photons penetrate into silicon layer 14. Part of these photons form electron/hole pairs before reaching reflective layers 32 and 34. The electrons of these pairs are attracted by regions 18 of photodiodes D. Another part of the photons crosses layer 14 and reaches one of reflective layers 32 or 34. These photons are then reflected towards the surface of silicon 14, and electron/hole pairs form as they rise back up. The electrons are then attracted by regions 18 of photodiodes D.

Preferably, the upper surface of reflective layer 32 is located at a depth greater than or equal to half the penetration depth of photons originating from red light rays, and the upper surface of reflective layer 34 is located at a depth greater than or equal to half the penetration depth of photons originating from green light rays. For example, the upper surface of layer 32 may be approximately 1.5 µm away from the surface of silicon 14 and the upper surface of layer 34 may be approximately 0.5 µm away from the surface of silicon 14.

FIGS. 2A to 2F illustrate results of steps of a method for forming the structure of FIG. 1.

Figure 2A:
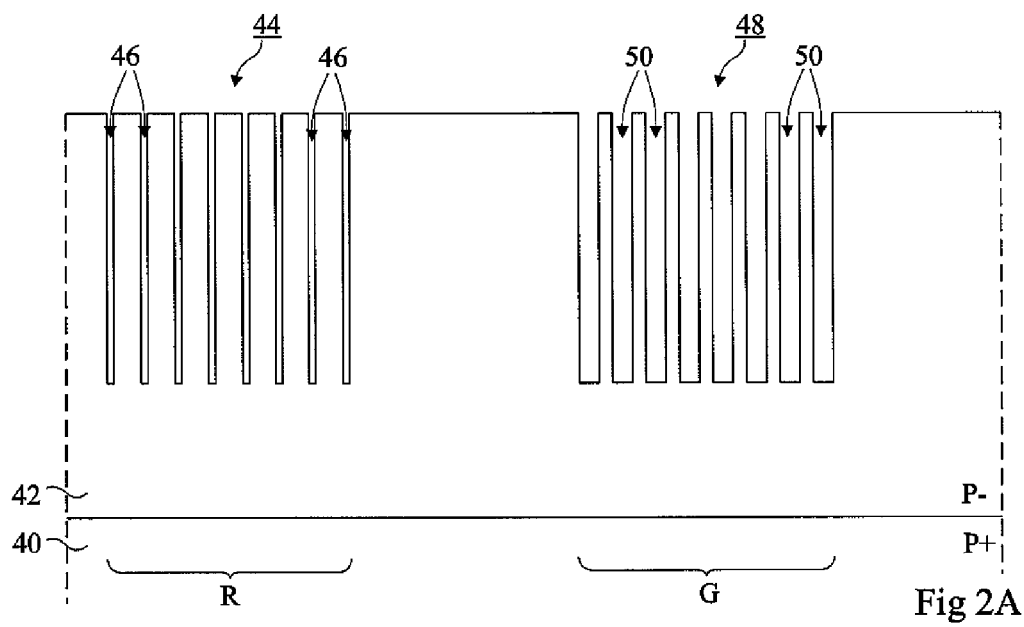
FIGS. 2A and 2C to 2F illustrate, in cross-section views, results of steps of a method for forming the structure of FIG. 1, FIG. 2B being a top view of the structure of FIG. 2A.
Figure 2B:
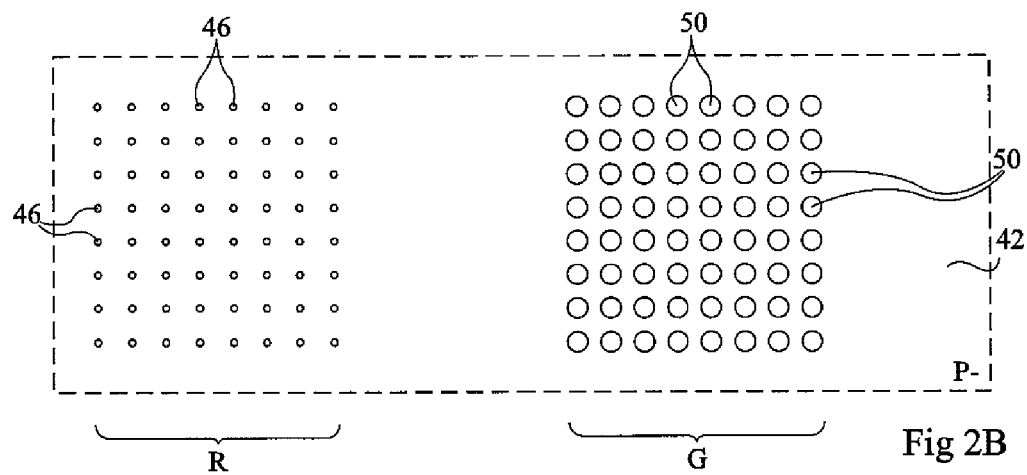

FIGS. 2A and 2B illustrates, respectively in cross-section view and in top view, a heavily-doped P-type silicon substrate 40 on which is formed a lightly-doped P-type silicon layer 42. As an example, layer 42 may have a thickness of approximately 3 µm and be formed by epitaxy on substrate 40. The structure of FIGS. 2A and 2B comprises two regions R and G corresponding to the active areas shown in FIG. 1. In active area R, an array 44 of openings 46 is formed. As better illustrated in top view, openings 46 are regularly spaced apart at the surface of layer 42. In active area G is formed an array 48 of openings 50, regularly spaced apart at the surface of silicon layer 42. Openings 50 have the same spacing as openings 46, but with larger cross-sections. As an example, openings 46 and 50 may have circular cross-sections and may be formed by plasma etching.

Figure 2C:
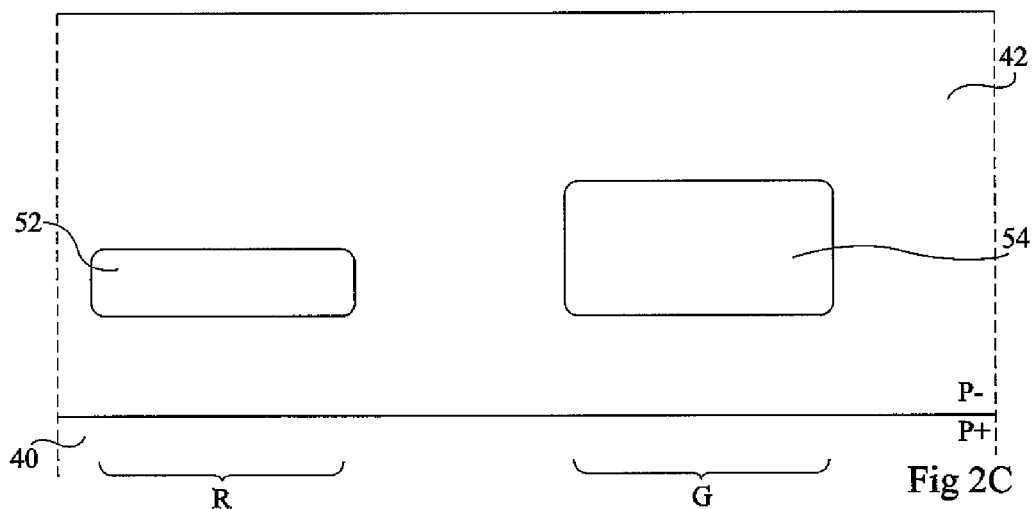

At the step illustrated in FIG. 2C, the structure of FIGS. 2A and 2B has been annealed. This anneal is performed at a temperature greater than 1100° C. under a hydrogen flow, for example for a few hundreds of seconds. It enables obtaining, in silicon layer 42, a buried cavity 52 in active area R and a buried cavity 54 in active area G. The upper surfaces of cavities 52 and 54 are at different levels. This level difference is linked to the difference in cross-sections of openings 46 and 50. For openings 46 and 50 to close, according to the above-described method, the ratio between the pitch between openings and the diameter of the openings is selected to be smaller than a given threshold which will be easily determined by those skilled in the art for single-crystal silicon of given orientation and doping. Adjusting the depth, the cross-section, and/or the pitch of the openings enables obtaining adapted cavities 52 and 54 having their upper surfaces at desired depths in layer 42.

The step of FIG. 2C may cause a slight depression of the upper surface of layer 42, above cavities 52 and 54. One may, if desirable in an embodiment, level the upper surface of layer 42 by any planarization method known by those skilled in the art, for example, a chem./mech. polishing process (CMP).

Figure 2D:
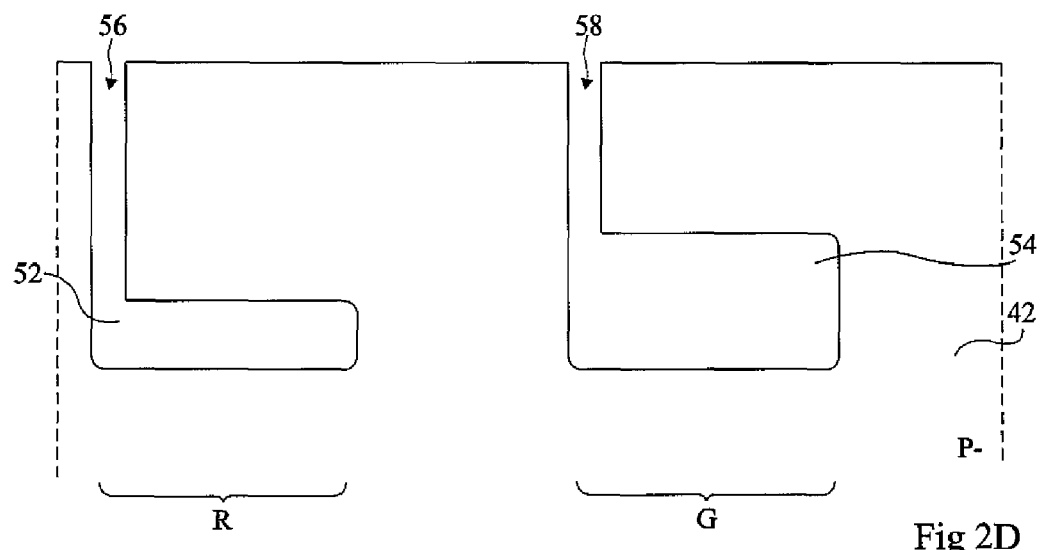

FIG. 2D illustrates the structure obtained after having formed, in active area R, a well 56 providing access, from the surface of silicon layer 42, to cavity 52 and, in active area G, a well 58 similarly providing access to cavity 54. Wells 56 and 58 may be formed by any known etch method, for example, by plasma etching.

Figure 2E:
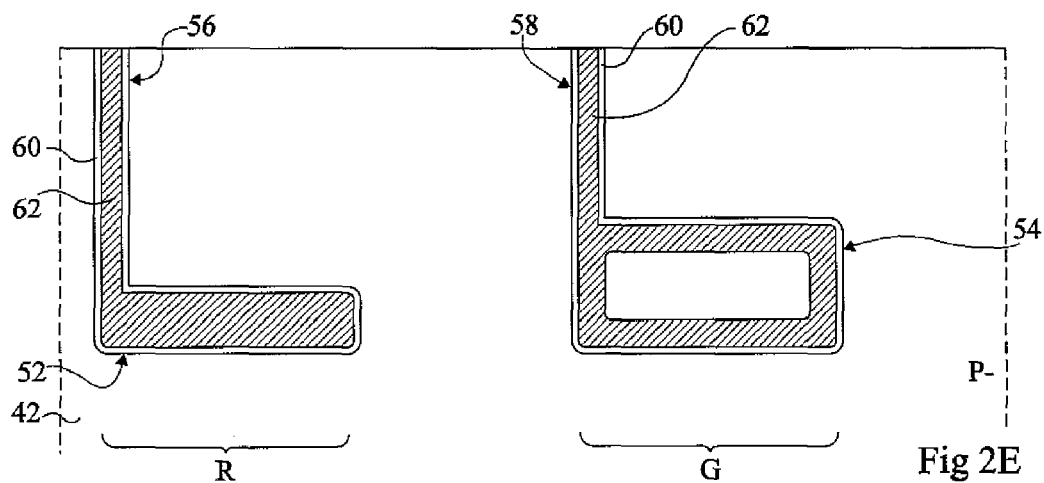

At the next step illustrated in FIG. 2E, a very thin insulating protection layer 60 is formed against the walls of cavities 52 and 54 and of wells 56 and 58. As an example, protection layer 60 may be made of silicon oxide and be formed by thermal oxidation of the walls of cavities 52 and 54 and of wells 56 and 58. Layer 60 may have a thickness smaller than 20 nm, that is, much smaller than one quarter of the wavelength of the light that the reflective layer is capable of reflecting. Thus, layer 60 creates no interference and it has no influence upon reflection phenomena. In addition to its insulation function, layer 60 especially aims at avoiding any reaction between the silicon of layer 42 and the material subsequently formed in cavities 52 and 54. One or several strongly reflective metals 62 are then deposited in cavities 52 and 54 and wells 56 and 58, against layer 60. For example, a metal such as tungsten (W) may be deposited by an atomic layer deposition method (ALD). This deposition may be performed to form a tungsten layer having a thickness of a few tens of nanometers, this being sufficient to reflect light beams currently used in the visible, ultraviolet, and infrared field. The reflective material may also be formed by chemical vapor deposition (CVD) if the material to be deposited allows it. Wells 56 and 58 being also filled with reflective material, they take part in the gathering of electrons towards the photodiodes. The space remaining in cavities 52 and 54 after deposition of the reflective material may be filled with a material such as silicon nitride, for example, by chemical vapor deposition (CVD). Generally, other materials or stacks of strongly-reflective materials at the selected wavelength may be used. One may for example use tantalum or stacks of materials with low and high refraction indexes forming a Bragg mirror.

Figure 2F:
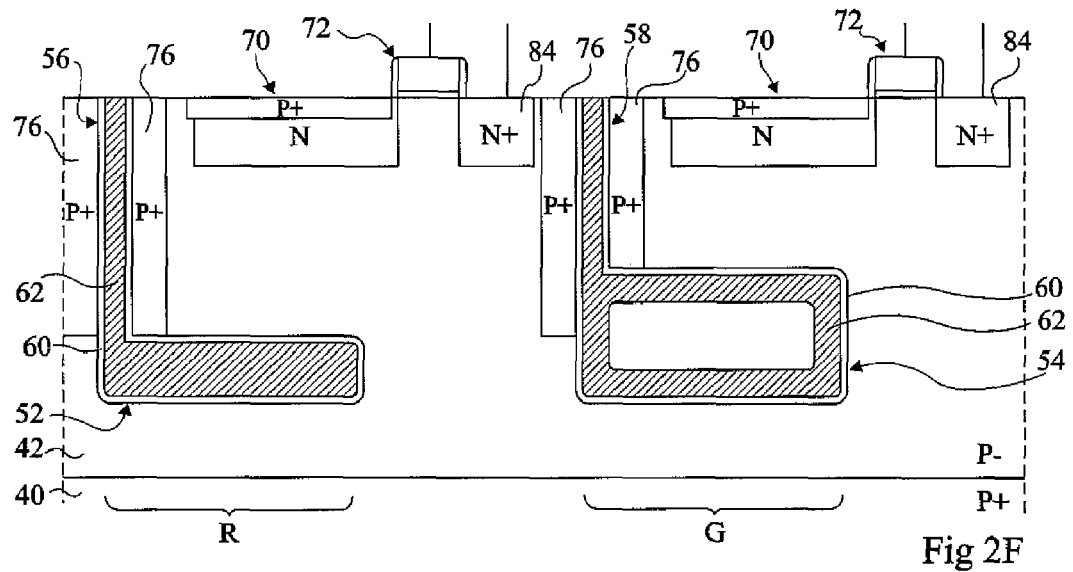

At the next step illustrated in FIG. 2F, the semiconductor regions forming the photodiodes, the MOS transistors, and possibly other components, are formed in silicon layer 42. In particular, above cavities 52 and 54, photodiodes 70 for example formed of an N-type doped region and, above this region, of a thin heavily-doped P-type region, are formed. Transfer transistors 72 having their sources corresponding to the N-type doped areas of photodiodes 70 and having as drains heavily-doped N-type regions 84 are also formed. As described in relation with FIG. 1, contacts are taken on the gates of transistors 72 and on their drains 84. Deep heavily-doped P-type regions 76 (P$^+$) are formed around wells 56 and 58. Techniques for forming such elements are well known by those skilled in the art. Adapted color filters (not shown) can then be formed above each photodiode.

Thus, a structure similar to that of FIG. 1 is obtained.

Advantageously, the reflective cavities may be used to form the mask necessary to form the doped areas of photodiodes 70. For this purpose, a resin is deposited over the structure. It is then insolated. During the insolation, the insolation rays penetrate into layer 42 and reflect on the reflective layers, which insolates the resin placed above the reflective layers for a second time. Known etch techniques (reflective photolithography) enable only etching the resin which has been insolated twice. A mask, self-aligned on the reflective cavities is thus obtained. This enables forming the implantation areas of the photodiodes above the reflective cavities with an accurate alignment.

Figure 3A:
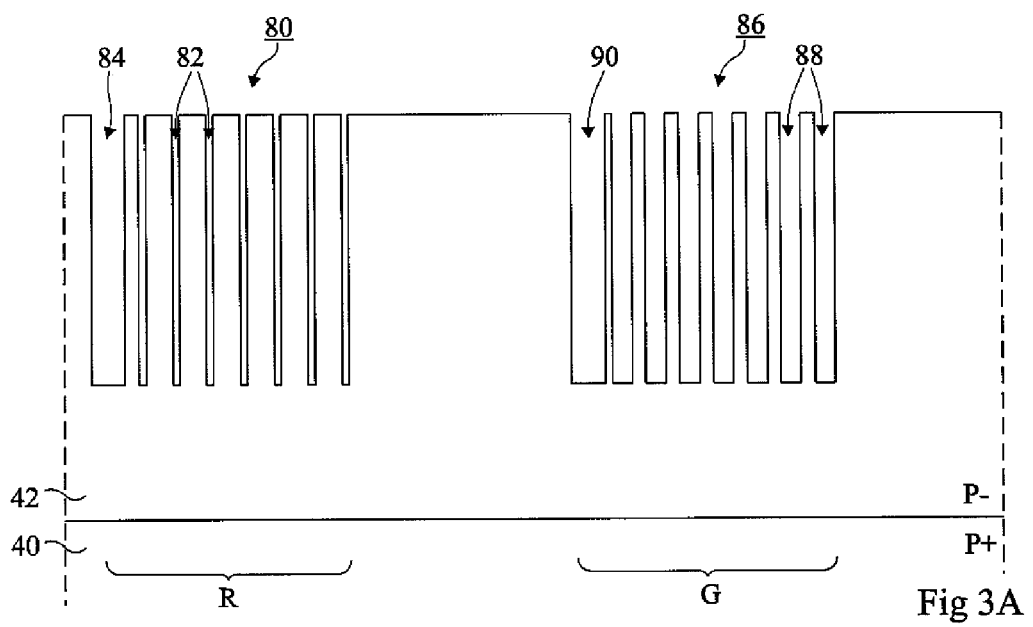
FIGS. 3A and 3C illustrate, in cross-section views, results of steps of a variation of the method of FIGS. 2A and 2C-2D, FIG. 3B being a top view of the structure of FIG. 3A.
Figure 3B:
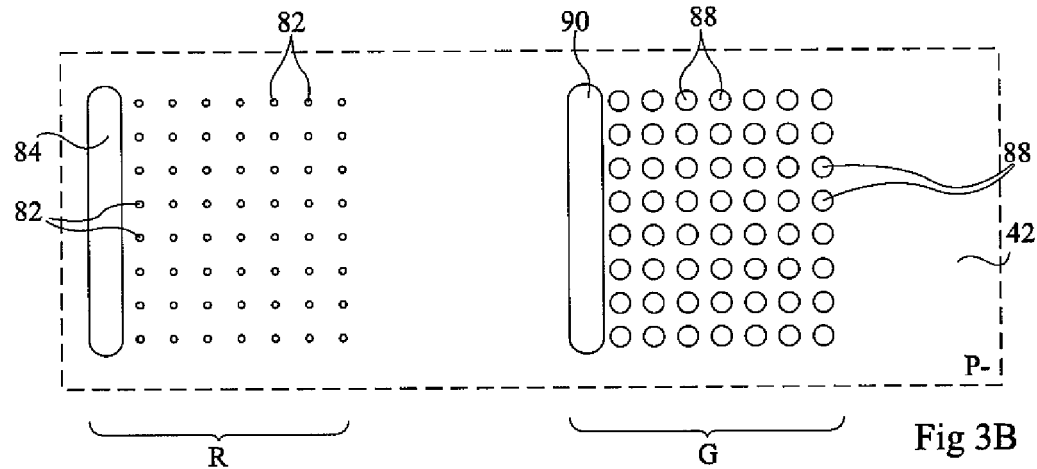
Figure 3C:
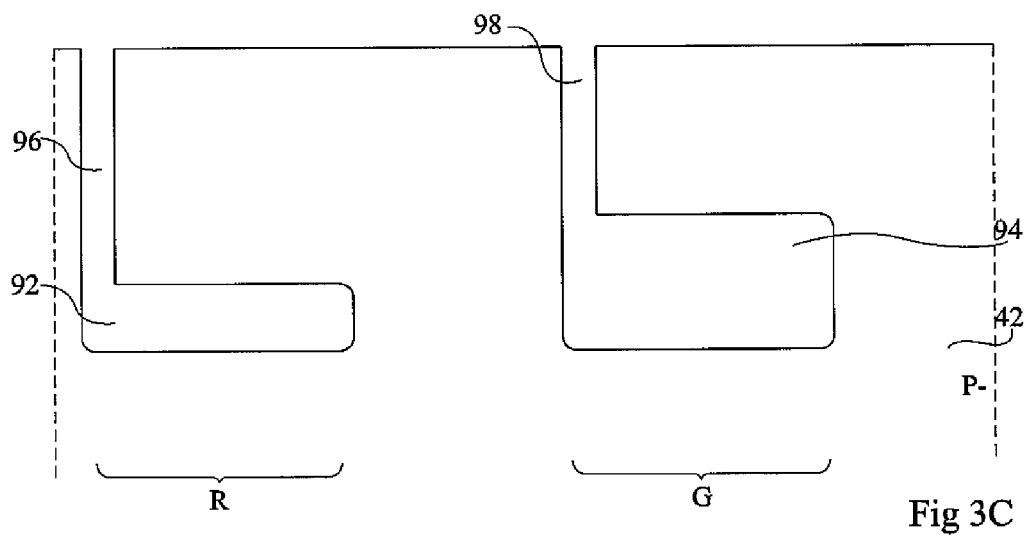

FIGS. 3A and 3C illustrate steps of a variation of the method of FIGS. 2A and 2C-2D, FIG. 3B being a top view of the structure of FIG. 3A.

As illustrated in FIGS. 3A and 3B, it is started from a heavily-doped P-type silicon substrate 40 on which is formed a lightly-doped P-type silicon layer 42. In region R is formed an array 80 of openings 82. On a side of this array is formed a trench 84, of same depth as openings 82. In region G is formed an array 86 of openings 88. On the side of array 86 is formed a trench 90 of same depth as openings 88. Openings 82 have smaller cross-sections than openings 88. Trenches 84 and 90 may have similar dimensions. Openings 82 and 88, as well as trenches 84 and 90, may be formed during a same etch step, for example, a plasma etching.

At the step illustrated in FIG. 3C, the structure of FIGS. 3A and 3B has been annealed at a temperature greater than 1100° C. During this anneal, conversely to openings 82 and 88, trenches 84 and 90, if their width is sufficient, do not close. The structure of FIG. 2D, that is, a structure comprising a buried cavity 92 in active area R, a buried cavity 96 in active area G, a well 96 having access to cavity 92, and a well 98 having access to cavity 94 is thus directly obtained. The next steps can then be the same as those described in relation with FIGS. 2E and 2F.

This variation has the advantage of forming the structure of FIG. 1 with a decreased number of steps.

As an example of numerical values for the method of FIGS. 2A to 2F, the following values may be selected:
diameter of openings 46=0.35 µm;
depth of openings 46=3 µm;
pitch between openings 46=0.7 µm;
diameter of openings 50=0.5 µm;
depth of openings 50=3 µm;
pitch between openings 50=0.7 µm.

By selecting these values, a cavity 52 is obtained, which has its upper surface located 1.2 µm away from the surface of silicon layer 42 and which has a thickness of approximately 0.4 µm. As for cavity 54, it has its upper surface located 0.8 µm away from the surface of silicon layer 42 and has a thickness of approximately 1 µm. To obtain depths adapted to the red and green light rays in active areas R and G, a silicon epitaxy may be carried out, after the step of FIG. 2E, above silicon layer 42 while protecting, if need be, the upper surface of material 62 flushing at the top of wells 56, 58. Further, the epitaxy may be performed with a gradual doping to create an electric field and allow a further improved electron collection. Here, this epitaxy may be performed to obtain an additional 300-nm silicon thickness. Thus, the upper surface of cavity 52 is located 1.5 µm away from the upper surface of silicon layer 42 and the upper surface of cavity 54 is located 1.1 µm away from the upper surface of silicon layer 42.

As a variation, rather than keeping a constant pitch between the different openings and selecting different cross-sections for openings 46 and 50, it may be chosen to form openings of equal cross-sections in the two active areas and to set the pitch of openings 46 to be different from the pitch of openings 50.

A portion of an image sensor comprising two active areas has been described. The image sensor may also conventionally comprise a third active area intended to detect blue light rays. A third reflective layer may be placed under this third active area to improve the collection of electrons originating from blue light rays. It should however be noted that this third reflective layer is less advantageous than those formed in the other active areas, since photons originating from blue light rays only slightly penetrate into the silicon. The upper surface of the third reflective layer, if provided, will be closer to the upper surface of the silicon than the upper surfaces of the other reflective layers.

Openings 46 and 50 have been described as having circular cross-sections. As a variation, these openings may have any adapted cross-section. Further, the buried reflective layers may be formed on a larger surface area than that described herein, for example, over the entire surface of the active areas.

Of course, the present invention is likely to have different variations and modifications which will readily occur to those skilled in the art. In particular, it will be within the abilities of those skilled in the art to devise other semiconductor components formed in active areas under which reflective layers are formed.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A semiconductor structure comprising: a first active area that is photosensitive under which is buried a first reflective layer and at least one second active area that is photosensitive under which is buried a second reflective layer, said semiconductor structure having a planar superior surface, wherein an upper surface of the second reflective layer is closer to an upper surface of the structure than an upper surface of the first reflective layer.

2. The semiconductor structure of claim 1, wherein the first and second reflective layers are made of tungsten.

3. The semiconductor structure of claim 1, further comprising a third active area under which is buried a third reflective layer, the upper surface of the third reflective layer being closer to the upper surface of the structure than the upper surface of the second reflective layer.

4. A semiconductor structure having a first surface, the semiconductor structure comprising:
   a first active area that is photosensitive;
   a first reflective layer formed adjacent to the first active area and at a first distance from the first surface;
   a second active area that is photosensitive; and
   a second reflective layer formed adjacent to the second active area and at a second distance from the first surface, the second distance being shorter than the first distance.

5. The semiconductor structure of claim 4, wherein the first active area and the second active area are each photosensitive active areas that emit electrons when light is impinging thereon.

6. The semiconductor structure of claim 5, wherein the first active area is sensitive to red light and the second active area is sensitive to green light.

7. The semiconductor structure of claim 4, wherein the first active area is sensitive to light of a first wavelength region, and
   wherein the first distance is greater than or equal to half of a first penetration depth of light of the first wavelength region.

8. The semiconductor structure of claim 7, wherein the first wavelength region is a visible red light wavelength region.

9. The semiconductor structure of claim 7, wherein the second active area is sensitive to light of a second wavelength region, and
   wherein the second distance is greater than or equal to half of a second penetration depth of light of the second wavelength region.

10. The semiconductor structure of claim 7, wherein the second wavelength region is a visible green light wavelength region.

11. The semiconductor structure of claim 4, further comprising:
    a third active area; and
    a third reflective layer formed adjacent to the third active area and at a third distance from the first surface, the third distance being shorter than the second distance.

12. The semiconductor structure of claim 11, wherein the first active area is sensitive to light of a visible blue light wavelength region, and
    wherein the first distance is greater than or equal to half of a first penetration depth of light of the visible blue light wavelength region.

13. The semiconductor structure of claim 4, wherein the semiconductor structure is configured such that first light impinges on the first reflective layer by passing through the first surface and through the first active area to reach the first reflective layer, the first reflective layer being configured to reflect at least some of the first light impinging on the first reflective layer to the first active area, and
    wherein the semiconductor structure is configured such that second light impinges on the second reflective layer by passing through the first surface and through the second active area to reach the second reflective layer, the second reflective layer being configured to reflect at least some of the second light impinging on the second reflective layer to the second active area.

* * * * *

UNITED STATES PATENT AND TRADEMARK OFFICE
CERTIFICATE OF CORRECTION

| | | |
|---|---|---|
| PATENT NO. | : 7,902,621 B2 | Page 1 of 1 |
| APPLICATION NO. | : 12/398872 | |
| DATED | : March 8, 2011 | |
| INVENTOR(S) | : Coudrain et al. | |

It is certified that error appears in the above-identified patent and that said Letters Patent is hereby corrected as shown below:

Claim 5, col. 7, lines 23-24 should read:
active area and the second active area that are photosensitive emit electrons when light is impinging Claim 11, col. 8, line 12 should read:
a third active area that is photosensitive; and Signed and Sealed this
Third Day of May, 2011

David J. Kappos
*Director of the United States Patent and Trademark Office*